US012255056B2

(12) United States Patent
Xu et al.

(10) Patent No.: US 12,255,056 B2
(45) Date of Patent: Mar. 18, 2025

(54) DIAGNOSTIC METHOD AND SYSTEM FOR MEASURING POTENTIAL AND ELECTRIC FIELD OF PLASMA

(71) Applicant: Southwest Jiaotong University, Chengdu (CN)

(72) Inventors: Yuhong Xu, Chengdu (CN); Danni Wu, Chengdu (CN); Yucai Li, Chengdu (CN); Haifeng Liu, Chengdu (CN); Jun Cheng, Chengdu (CN); Junfeng Shen, Chengdu (CN); Hai Liu, Chengdu (CN); Xianqu Wang, Chengdu (CN); Jie Huang, Chengdu (CN); Xin Zhang, Chengdu (CN); Jun Hu, Chengdu (CN); Wei Li, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 0 days.

(21) Appl. No.: 18/759,759

(22) Filed: Jun. 28, 2024

(65) Prior Publication Data

US 2024/0355599 A1    Oct. 24, 2024

Related U.S. Application Data

(63) Continuation of application No. PCT/CN2024/093789, filed on May 17, 2024.

(30) Foreign Application Priority Data

Jan. 9, 2024 (CN) .......................... 202410030701.3

(51) Int. Cl.
*G21B 1/05* (2006.01)
*H01J 37/32* (2006.01)

(52) U.S. Cl.
CPC .. *H01J 37/32935* (2013.01); *H01J 37/32926* (2013.01); *G21B 1/05* (2013.01)

(58) Field of Classification Search
CPC .......... H01J 37/32935; H01J 37/32926; H01J 37/32917; H01J 37/32954; H01J 49/147;
(Continued)

(56) References Cited

U.S. PATENT DOCUMENTS 4,682,564 A * 7/1987 Cann .................. H05H 1/54
                                                         118/721
6,486,605 B1 * 11/2002 Beunas ................ H01J 23/09
                                                         315/5

(Continued)

FOREIGN PATENT DOCUMENTS

CN    107843776 A    3/2018
CN    110024489 A    7/2019
(Continued)

OTHER PUBLICATIONS

Huiquan He et al., "Losses Analyse and Depositing of Neutral Beam Along the Beam Line", Vacuum and Cryogenics, Sep. 30, 2003, vol. 9, No. 3, pp. 175-178.

*Primary Examiner* — Jeffrey P Aiello (57) ABSTRACT

A diagnostic method and system for measuring potential and electric field of plasma are provided. According to operation parameters of a magnetic confinement fusion device and relevant parameter data of a plurality of candidate particle elements, signal-noise ratios are calculated. to select a neutral beam particle element. Beam trajectories varying in incident velocity, incident angle and sampling area are obtained by iterative calculation, and a preset parameter which enables the beam trajectories to pass through an entrance slit of an analyzer is obtained. A neutral beam that meets the preset parameter is injected into the plasma. An energy of the primary beam generated by collision ioniza-
(Continued)

tion in a sampling area is measured, and potential of the sampling area is obtained according to law of conservation of energy. Sampling areas are detected to obtain potential spatial distribution of the plasma and a radial electric field, and the diagnostic is finished.

7 Claims, 5 Drawing Sheets

(58) Field of Classification Search
CPC ....... H01J 2237/334; G21B 1/00; G21B 1/05; G21B 1/03; G21B 1/052; H05H 1/0081; H05H 1/00; H05H 1/0006; H05H 1/24; H05H 1/0012; H05H 9/00; H05H 3/00
USPC .... 702/183, 189, 127, 28, 32, 1, 57, 85, 29, 702/135, 149, 8, 58; 703/2, 13
See application file for complete search history.

(56) References Cited

U.S. PATENT DOCUMENTS

| | | | |
|---|---|---|---|
| 8,481,931 B2 * | 7/2013 | Page | H01J 37/30 250/281 |
| 9,941,094 B1 * | 4/2018 | van Kouwen | H01J 37/08 |
| 2010/0012839 A1 * | 1/2010 | Notte, IV | H01J 27/024 250/423 F |

FOREIGN PATENT DOCUMENTS

| | | |
|---|---|---|
| CN | 112992385 A | 6/2021 |
| EP | 0719077 A1 | 6/1996 |
| GB | 1210218 A | 10/1970 |
| GB | 1555840 A | 11/1979 |
| GB | 2546060 A | 7/2017 |
| WO | 2009005060 A1 | 1/2009 |

* cited by examiner

```
┌─────────────────────────────────────────────────────────────┐
│ According to an operation parameter of a magnetic confinement fusion device, │
│ a plurality of elements are selected as a plurality of candidate particle elements, │
│ and relevant parameter data of the plurality of candidate particle elements is │
│ obtained, where the relevant parameter data includes particle mass data,    │── S100
│ primary collision ionization cross section data and secondary collision    │
│ ionization cross section data. The operation parameter includes a background │
│ magnetic field of the magnetic confinement fusion device, an electron      │
│ temperature of a plasma and an electron density of the plasma              │
└─────────────────────────────────────────────────────────────┘
                              ▼
┌─────────────────────────────────────────────────────────────┐
│ Based on the operation parameter and the relevant parameter data, beam │
│ trajectories and effective electron-impact ionization cross-section data of the │
│ plurality of candidate particle elements are calculated. Signal-noise ratios of │
│ the plurality of candidate particle elements are calculated based on the beam │── S200
│ trajectories and the effective electron-impact ionization cross-section data. │
│ According to the signal-noise ratios, an appropriate element is selected from │
│ the plurality of candidate particle elements as a neutral beam particle element │
│ for diagnosis                                                              │
└─────────────────────────────────────────────────────────────┘
                              ▼
┌─────────────────────────────────────────────────────────────┐
│ Based on particle mass data of the neutral beam particle element, a preset │
│ parameter which enables the beam trajectories to pass through an entrance │── S300
│ slit of an analyzer is obtained by performing iterative calculation, where the │
│ preset parameter includes incident energy, an incident angle and sampling area │
└─────────────────────────────────────────────────────────────┘
                              ▼
┌─────────────────────────────────────────────────────────────┐
│ The solid-state thermionic source corresponding to the neutral beam particle │
│ element is heated to generate ions, and the ions are accelerated by utilizing │
│ Pierce electrode equipment to obtain a directed ion beam. The directed ion │── S400
│ beam is subjected to exchange with a preset neutral gas to generate a neutral │
│ beam with a preset incident energy. Based on the preset parameter, the neutral │
│ beam is injected into the plasma at the preset incident angle              │
└─────────────────────────────────────────────────────────────┘
                              ▼
┌─────────────────────────────────────────────────────────────┐
│ A primary beam generated by the collision ionization of the neutral beam in │
│ the sampling area is analyzed and calculated by the analyzer to obtain the │
│ energy of the primary beam. Based on the energy difference between the    │
│ primary beam and the neutral beam, the potential of the first sampling area is │── S500
│ obtained according to law of conservation of energy. The iterative calculation │
│ is repeated and the preset parameter is changed to collect an energy of a │
│ primary beam in the second sampling area. The potential spatial distribution │
│ of the plasma at different radial positions and the radial electric field are │
│ obtained, and the diagnosis is finished                                    │
└─────────────────────────────────────────────────────────────┘
```

DIAGNOSTIC METHOD AND SYSTEM FOR MEASURING POTENTIAL AND ELECTRIC FIELD OF PLASMA

CROSS-REFERENCE TO RELATED APPLICATIONS

This application is a continuation of International Patent Application No. PCT/CN2024/093789, filed on May 17, 2024, which claims the benefit of priority from Chinese Patent Application No. 202410030701.3, filed on Jan. 9, 2024. The content of the aforementioned application, including any intervening amendments thereto, is incorporated herein by reference in its entirety.

TECHNICAL FIELD

This application relates to neutral beam probe diagnostic, and more particularly to a diagnostic method and system for measuring potential and electric field of plasma.

BACKGROUND

The radial electric field $E_r$ and $E_r \times B$ flow shear in the magnetic confinement fusion plasma are of great significance for inhibiting the plasma turbulent transport and improving the confinement. Currently, only the heavy ion beam probe (HIBP) can realize the high temporal-spatial resolution measurement for the potential ($\varphi$) and the radial electric field ($E_r = -\nabla_r \varphi$) of the plasma in the core area, and therefore the HIBP has been widely used in fusion devices. Specifically, the HIBP can measure the energy of the secondary beams generated by collision ionization between the single-charged ion beam and electrons in the plasma to obtain local potential (electric field) and its fluctuation in the ionization region (namely, the sample volume). Such method is only applicable to the plasma with a high temperature and density, and for the low-temperature and low-density plasma, the HIBP is less effective and applicable.

SUMMARY

An object of this application is to provide a diagnostic method and system for measuring potential and electric field of plasma to solve the above problems in the prior art.

Technical solutions of the present disclosure are described as follows.

In a first aspect, this application provides a diagnostic method for measuring potential and electric field of plasma, comprising:

(1) according to an operation parameter of a magnetic confinement fusion device, selecting a plurality of candidate particle elements, and obtaining relevant parameter data of the plurality of candidate particle elements; wherein the relevant parameter data comprises particle mass data, primary collision ionization cross section data and secondary collision ionization cross section data; the operation parameter comprises a background magnetic field of the magnetic confinement fusion device, an electron temperature of a plasma and an electron density of the plasma;

(2) based on the operation parameter and the relevant parameter data, calculating beam trajectories and effective electron-impact ionization cross-section data of the plurality of candidate particle elements, and calculating signal-noise ratios of the plurality of candidate particle elements based on the beam trajectories and the effective electron-impact ionization cross-section data; and according to the signal-noise ratios, selecting an appropriate element from the plurality of candidate particle elements as a neutral beam particle element for diagnosis;

(3) based on particle mass data of the neutral beam particle element, performing iterative calculation to obtain a preset parameter which enables the beam trajectories to pass through an entrance slit of an analyzer; wherein the preset parameter comprises incident energy, an incident angle and a sampling area;

(4) heating solid-state thermionic source corresponding to the neutral beam particle element to generate ions, and accelerating the ions by utilizing Pierce electrode equipment to obtain a directed ion beam; subjecting the directed ion beam to exchange with a preset neutral gas charge to generate a neutral beam with a preset incident energy; and based on the preset parameter, injecting the neutral beam into the plasma at a preset incident angle; and (5) analyzing and calculating, by the analyzer, a primary beam generated by collision ionization of the neutral beam in a first sampling area to obtain an energy of a primary beam; based on energy difference between the primary beam and the neutral beam, obtaining a potential of the first sampling area according to law of conservation of energy; repeating the above steps to collect an energy of a primary beam generated in a second sampling area, thereby obtaining potential spatial distribution of the plasma at different radial positions and a radial electric field; and finishing the diagnosis.

In an embodiment, the step of calculating the beam trajectories based on the operation parameter and the relevant parameter data comprises:

based on the particle mass data, injecting a neutral beam of one of the plurality of candidate particle elements into the plasma at a certain incident velocity and a certain incident angle to undergo collision ionization with electrons in the plasma to generate the primary beam; wherein the primary beam deflects and exits the plasma under the action of a background magnetic field; and each of the beam trajectories is calculated as follows:

$$m\frac{d^2 r(t)}{dt^2} = q\frac{dr(t)}{dt} \times B;$$

and $$\frac{dr(t=0)}{dt} = v_0;$$

wherein r(t) represents a beam trajectory; d represents a differential sign; dr(t) represents a differential of r(t); t represents time; dt represents a differential of t; $v_0$ represents an incident velocity of the neutral beam; m represents a particle mass of a corresponding candidate particle element; q represents the number of electric charges; for the neutral beam, q=0, and for the primary beam, q=e, wherein e represents the number of electric charges of an electron; B represents the background magnetic field; a particle movement velocity $v_b$ along the beam trajectory is represented as $$v_b = \left|\frac{dr(t)}{dt}\right| \approx v_0;$$

for neutral beams of other elements among the plurality of candidate particle elements, in the same beam trajectory, an incident velocity $v_0'$ is obtained according to the same Larmor radius through the following equation:

$$\frac{v_0'}{v_0} = \frac{m}{m'},$$

wherein m' represents particle mass of the other elements.

In an embodiment, the step (2) is performed through steps of:

calculating the effective electron-impact ionization cross-section data based on a Maxwell speed distribution function, the primary collision ionization cross section data and the secondary collision ionization cross section data through the following equation:

$$\sigma_{\it eff} = \frac{\langle \sigma v \rangle}{v_b} = \int_0^\infty \sigma(v) v f(v) dv =$$
$$\sqrt{\frac{m_e}{2\pi k T_e}} \frac{1}{v_b^2} \int_0^\infty \sigma(v) v^2 \left[ \exp\left(-\frac{m_e}{2kT_e}(v-v_b)^2\right) - \exp\left(-\frac{m_e}{2kT_e}(v+v_b)^2\right) \right] dv;$$

wherein v represents a particle-electron relative velocity, and $v=|v_b-v_e|$, wherein $v_b$ represents a particle movement velocity, and $v_e$ represents an electron movement velocity; d represents the differential sign; dv represents a differential of v; f(v) represents the Maxwell speed distribution function; $T_e$ represents the electron temperature of the plasma; $m_e$ represents an electron mass; k represents a Boltzmann constant; σ(v) represents a collision ionization cross section; $\sigma_{\it eff}$ represents an effective collision ionization cross section, wherein a primary effective collision ionization cross section $\sigma_{\it eff}^1$ is obtained by substituting a primary collision ionization cross section $\sigma_1(v)$ into the above equation, and a secondary effective collision ionization cross section $\sigma_{\it eff}^2$ is obtained by substituting a secondary collision ionization cross section $\sigma_2(v)$ into the above equation;

calculating the signal-noise ratios of the plurality of candidate particle elements according to the operation parameter, the relevant parameter data, the beam trajectories and the effective electron-impact ionization cross-section data through the following equation:

$$I_d/I_0 = n_e \sigma_{\it eff}^1 w \cdot \exp\left(-\int_0^{t_i} n_e \sigma_{\it eff}^1 dl - \int_{t_i}^{t_d} n_e \sigma_{\it eff}^2 dl\right);$$

wherein $I_d/I_0$ represents a signal-noise ratio; $n_e$ represents the electron density of the plasma; w represents a width of the entrance slit; d represents the differential sign; dl represents a differential of l; l represents the beam trajectory; $t_i$ represents a time that the neutral beam reaches a core of the plasma to undergo collision ionization to generate the primary beam; $t_d$ represents a time that the primary beam exits the plasma; and $\sigma_{\it eff}^1$ is the primary effective collision ionization cross section, and $\sigma_{\it eff}^2$ is the secondary effective collision ionization cross section; and according to the signal-noise ratios of the plurality of candidate particle elements, selecting an element with a signal-noise ratio higher than $10^{-3}$ as the neutral beam particle element for the diagnosis.

In an embodiment, the step (3) is performed through steps of obtaining the beam trajectories varying in incident velocity, incident angle and sampling area through beam trajectory calculation; wherein the beam trajectories comprise a trajectory of the neutral beam arriving at the first sampling area and a trajectory of the primary beam trajectory generated by the collision ionization; and subjecting the beam trajectories to the iterative calculation to obtain the preset parameter which enables the beam trajectories to pass through the entrance slit of the analyzer; wherein the preset parameter comprises the neutral beam incident energy, a neutral beam incident angle and sampling area.

In an embodiment, the step (4) is performed through steps of:

selecting the solid-state thermionic source corresponding to the neutral beam particle element, and heating the solid-state thermionic source to generate the ions; and accelerating the ions by utilizing the Pierce electrode equipment, and focusing the ions under the action of an electrostatic lens to obtain the directed ion beam; and leading the directed ion beam into a neutralizer tank followed by exchanging with the preset neutral gas charge to generate the neutral beam with the preset incident energy; and injecting the neutral beam into the plasma at a preset incident angle.

In an embodiment, in the step (5), the potential is obtained through the following equation:

$$\varphi_i = \frac{E_d - E_0}{e};$$

wherein $\varphi_i$ represents the potential of the sampling area; $E_d$ represents an energy of a primary beam; $E_0$ represents the incident energy of the neutral beam; and e represents the number of electric charges of an electron.

In a second aspect, this application also provides a diagnostic system for measuring potential and electric field of plasma, comprising:

a first acquisition module;
a first calculation module;
a second calculation module;
a third calculation module; and
a second acquisition module;

wherein the first acquisition module is configured to select a plurality of elements as candidate particle elements according to an operation parameter of a magnetic confinement fusion device to obtain relevant parameter data of the plurality of candidate particle elements; wherein the relevant parameter data comprises particle mass data, primary collision ionization cross section data and secondary collision ionization cross section data; and the operation parameter comprises a background magnetic field of the magnetic confinement fusion device, an electron temperature of a plasma and an electron density of the plasma;

the first calculation module is configured to calculate beam trajectories and effective electron-impact ionization cross-section data of the plurality of candidate particle elements, and calculate signal-noise ratios of the plurality of candidate particle elements based on the beam trajectories and the effective electron-impact ionization cross-section data; and the first calculation module is also configured to select an appropriate element from the plurality of candidate particle elements as a neutral beam particle element for diagnosis according to the signal-noise ratios;

the second calculation module is configured to obtain a preset parameter which enables the beam trajectories to pass through an entrance slit of an analyzer by performing iterative calculation based on particle mass data of the neutral beam particle element; wherein the preset parameter comprises incident energy, incident angle and sampling area;

the third calculation module is configured to heat a solid-state thermionic source corresponding to the neutral beam particle element to generate ions, and accelerate the ions by utilizing Pierce electrode equipment to obtain a directed ion beam; and the third calculation module is also configured to exchange the directed ion beam with a preset neutral gas charge to generate a neutral beam with a preset incident energy; and based on the preset parameter, the third calculation module is configured to inject the neutral beam into the plasma at a preset incident angle;

the second acquisition module is configured to analyze and calculate a primary beam generated by collision ionization of the neutral beam in the sampling area by the analyzer to obtain an energy of a primary beam; and the second acquisition module is configured to obtain a potential of a first sampling area according to law of conservation of energy based on energy difference between the primary beam and the neutral beam, and collect an energy of the primary beam generated in a second sampling area by repeating the iterative calculation and changing the preset parameter, thereby obtaining potential spatial distribution of the plasma at different radial positions and a radial electric field, and finishing the diagnosis.

The present disclosure has the following beneficial effects.

The present disclosure provides a neutral beam probe diagnostic technology. The diagnostic system of the present disclosure is configured to subject the neutral beam to primary collision ionization with the plasma to generate the primary beam, and measure the energy of the primary beam to obtain a local potential (electric field) and its fluctuation in the sampling area. The present disclosure is to provide the neutral beam probe diagnostic (NBP) technology with small interference and high temporal-spatial resolution, which is suitable for plasma with low parameters, and is configured to measure the potential (electric field) of the plasma and its fluctuation based on the principle of HIBP commonly used in a high-temperature core of the plasma. Compared to the traditional HIBP, the diagnostic system of the present disclosure can still obtain sufficient signal-noise ratios when parameters of the plasma are low.

The NBP technology of the present disclosure is mainly aimed at measuring the potential (electric field) and its fluctuation of the plasma with low parameters, characterized by the small interference and the high temporal-spatial resolution, and still able to obtain relatively high signal-noise ratios with low temperature or low electron density. It should be noted that the measurement technology provided in the present disclosure is the only measurement mean that can be used to directly measure the potential and the electric field in the plasma with low parameters, which has extremely important significance for in-depth study of the physical mechanism of turbulent inhibition by $E_r \times B$ flow shear in the magnetic confinement fusion plasma and confinement improvement.

Other features and advantages of the present disclosure will be described in subsequent specification, and partly become apparent from the specification or be understood by implementing embodiments of the present disclosure. The objects and other advantages of the present disclosure can be realized and obtained by means of the structure specifically indicated in the specification, claims, and accompanying drawings.

BRIEF DESCRIPTION OF THE DRAWINGS

To clearly illustrating the technical solutions of embodiments of the present disclosure, accompanying drawings needed in the embodiments will be briefly introduced below. It should be understood that following accompanying drawings are only illustrative rather than limiting the scope of the present disclosure. Those skilled in the art can obtain other drawings according to these accompanying drawings without making any creative effort.

In the figures: 701, first acquisition module; 702, first calculation module; 7021, collision unit; 703, second calculation module; 7031, first calculation unit; 7032, second calculation unit; 7033, third calculation unit; 7034, fourth calculation unit; 7035, selection unit; 704, third calculation module; 7041, select unit; 7042, focus unit; 7043, exchange unit; 7044, fifth calculation unit; and 705, second acquisition module.

DETAILED DESCRIPTION OF EMBODIMENTS

To make the objectives, technical solutions and advantages of the present disclosure clearer, the present disclosure will be clearly and completely described below with reference to the accompanying drawings in embodiments. It is obvious that the embodiments described herein are only part of embodiments of the present disclosure rather than all embodiments. The components of embodiments of the present disclosure commonly described and shown herein can be arranged and designed in different configurations. Therefore, the detailed description of embodiments of the present disclosure provided in the accompanying drawings is only to illustrate selected embodiments of the present disclosure rather than limiting the scope of the present disclosure. And any other embodiments made by those skilled in the art based on the embodiments of the present disclosure without creative effort shall fall within the scope of the present disclosure.

It should be noted that similar labels and letters represent similar items in the accompanying drawings below, therefore, as long as an item is defined in a drawing, it does not need to be further defined and explained in subsequent drawings. At the same time, in the description of the disclosure, the terms "first", "second", etc., are only used for distinguishment, and cannot be understood as indicating or implying relative importance.

Embodiment 1

A diagnostic method for measuring potential and electric field of plasma is provided in this embodiment.

Referring to FIGS. 1-4, the diagnostic method includes steps (S100)-(S500).

Figure 1:
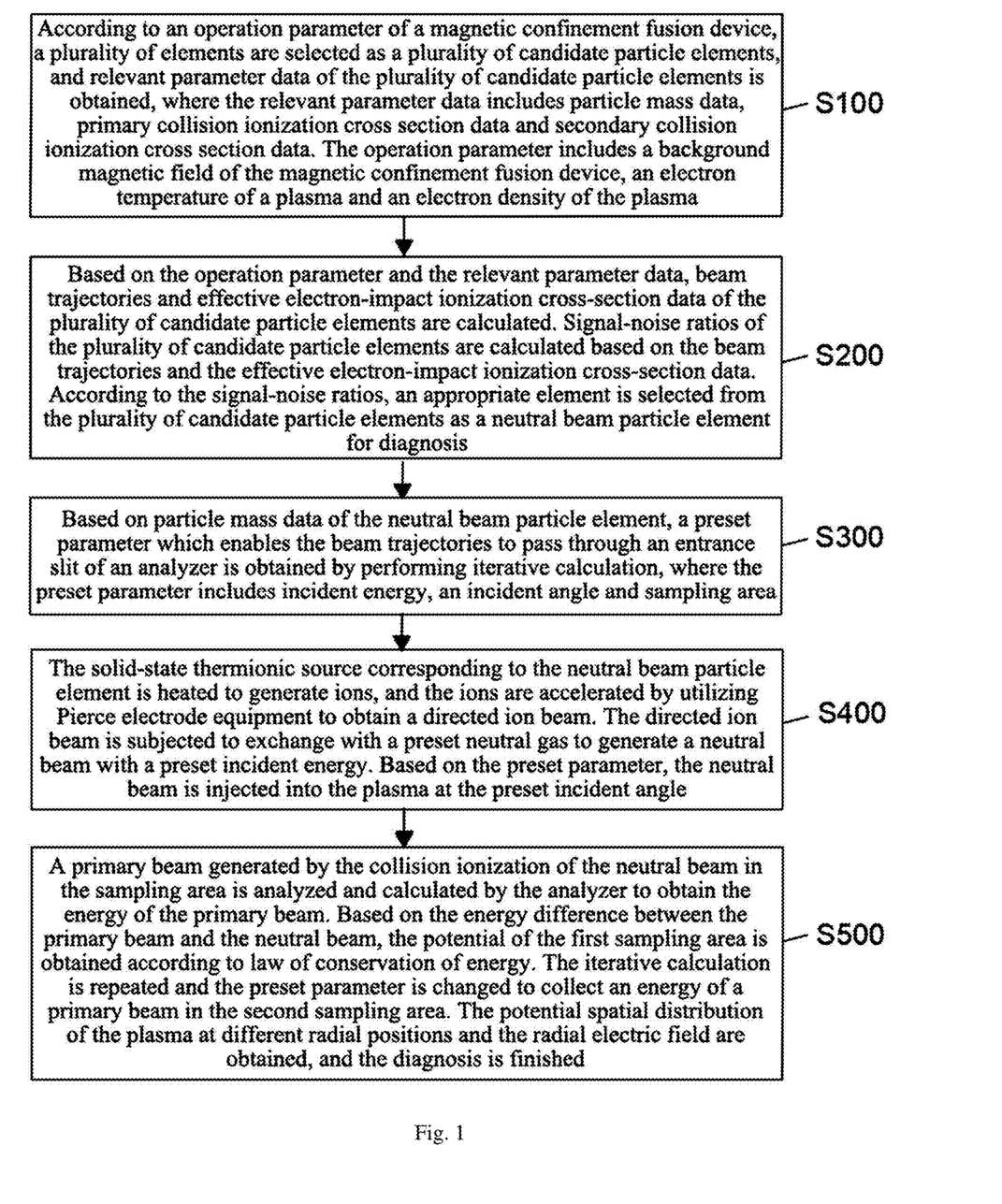
FIG. 1 is a flow diagram of a diagnostic method for measuring potential and electric field of plasma according to an embodiment of the present disclosure.

(S100) According to an operation parameter of a magnetic confinement fusion device, a plurality of elements are selected as a plurality of candidate particle elements, and relevant parameter data of the plurality of candidate particle elements is obtained, where the relevant parameter data includes particle mass data, primary collision ionization cross section data and secondary collision ionization cross section data. The operation parameter includes a background magnetic field of the magnetic confinement fusion device, an electron temperature of a plasma and an electron density of the plasma.

It can be understood that in the step (S100), according to the operation parameter of the magnetic confinement fusion device including the background magnetic field B of the magnetic confinement fusion device, the electron temperature $T_e$ of the plasma and the electron density $n_e$ of the plasma, the plurality of elements, such as sodium, potassium, rubidium and cesium, are selected as the plurality of candidate particle elements to obtain a particle mass m, a primary collision ionization cross section $\sigma_1(v)$ and a secondary collision ionization cross section $\sigma_2(v)$, where v represents a relative velocity of the particle to the electron.

(S200) Based on the operation parameter and the relevant parameter data, beam trajectories and effective electron-impact ionization cross-section data of the plurality of candidate particle elements are calculated. Signal-noise ratios of the plurality of candidate particle elements are calculated based on the beam trajectories and the effective electron-impact ionization cross-section data. According to the signal-noise ratios, an appropriate element is selected from the plurality of candidate particle elements as a neutral beam particle element for diagnosis.

It can be understood that the step (S200) includes steps (S201)-(S204).

Figure 2:
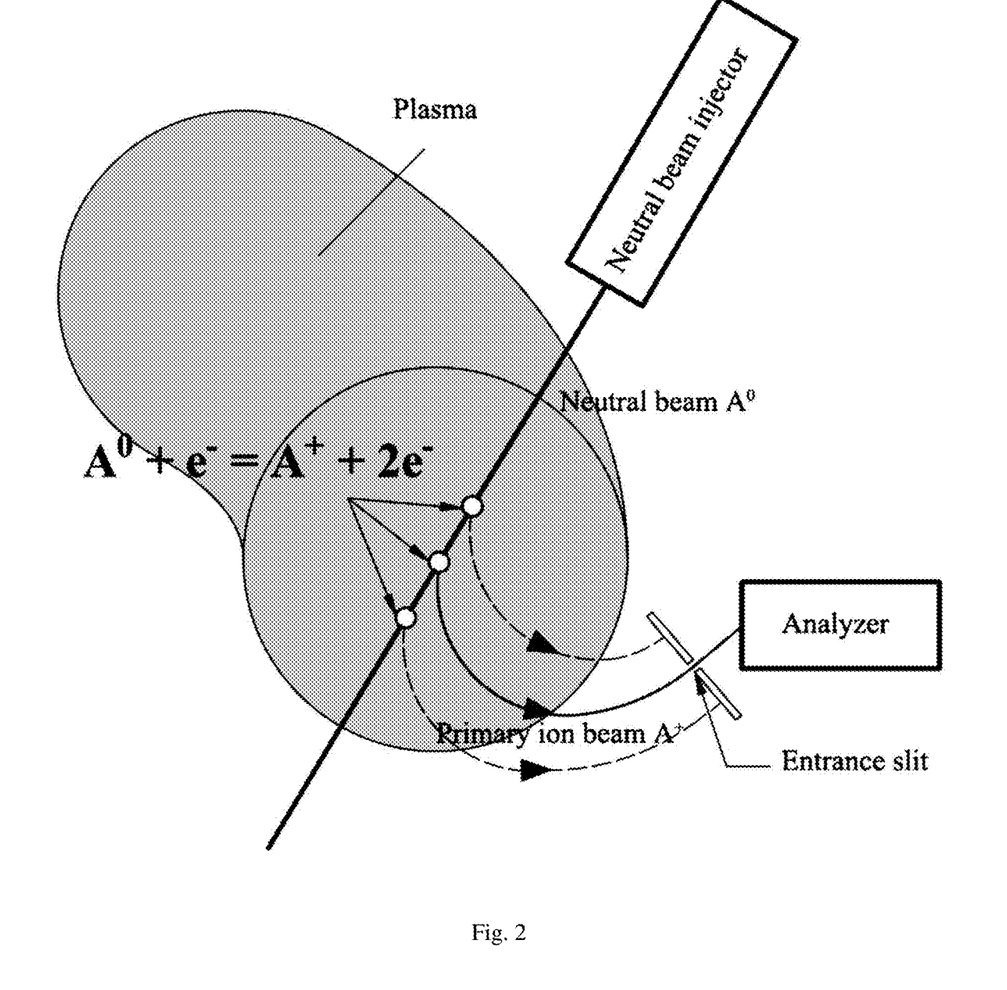
FIG. 2 schematically illustrates basic principles of the diagnostic method according to an embodiment of the present disclosure.

(S201) Based on the particle mass data, a neutral beam of one of the plurality of candidate particle elements is injected into the plasma at a certain incident velocity and a certain incident angle to undergo collision ionization with electrons in the plasma to generate a primary beam, where the primary beam deflects and exits the plasma under the action of a background magnetic field. Each of the beam trajectories is calculated as follows:

$$m\frac{d^2r(t)}{dt^2} = q\frac{dr(t)}{dt} \times B; \text{ and}$$

$$\frac{dr(t=0)}{dt} = v_0;$$

where r(t) represents a beam trajectory; d represents a differential sign; dr(t) represents a differential of r(t); t represents time; dt represents a differential of t; $v_0$ represents an incident velocity of the neutral beam; m represents a particle mass of a corresponding candidate particle element; q represents the number of electric charges; for the neutral beam, q=0, and for the primary beam, q=e, where e represents the number of electric charges of an electron; B represents the background magnetic field; a particle movement velocity $v_b$ along the beam trajectory is represented as $$v_b = \left|\frac{dr(t)}{dt}\right| \approx v_0;$$

for neutral beams of other elements among the plurality of candidate particle elements, in the same beam trajectory, an incident velocity $v_0'$ is obtained according to the same Larmor radius through the following equation:

$$\frac{v_0'}{v_0} = \frac{m}{m'},$$

where m' represents particle mass of the other elements.

It should be noted that, the beam trajectory r(t) of one of the plurality of candidate particle elements is assumed to be as: the neutral beam is injected into the plasma with a certain incident velocity and a certain incident angle followed by collision ionization with the electrons in a core of the plasma to generate the primary beam, and the primary beam deflects and exits the plasma under the action of the background magnetic field B.

(S202) Based on a Maxwell speed distribution function, the primary collision ionization cross section data and the secondary collision ionization cross section data, the effective electron-impact ionization cross-section data is calculated through the following equation:

$$\sigma_{eff} = \frac{\langle \sigma v \rangle}{v_b} = \int_0^\infty \sigma(v) v f(v) dv =$$
$$\sqrt{\frac{m_e}{2\pi k T_e}} \frac{1}{v_b^2} \int_0^\infty \sigma(v) v^2 \left[\exp\left(-\frac{m_e}{2kT_e}(v-v_b)^2\right) - \exp\left(-\frac{m_e}{2kT_e}(v+v_b)^2\right)\right] dv;$$

where v represents a particle-electron relative velocity, and v=|$v_b-v_e$|, where $v_b$ represents a particle movement velocity, and $v_e$ represents an electron movement velocity; d represents the differential sign; dv represents a differential of v; f(v) represents the Maxwell speed distribution function; $T_e$ represents the electron temperature of the plasma; $m_e$ represents an electron mass; k represents a Boltzmann constant; $\sigma(v)$ represents a collision ionization cross section; $\sigma_{eff}$ represents an effective collision ionization cross section, where a primary effective collision ionization cross section $\sigma_{eff}^1$ is obtained by substituting a primary collision ionization cross section $\sigma_1(v)$ into the above equation, and a secondary effective collision ionization cross section a $\sigma_{eff}^2$ is obtained by substituting a secondary collision ionization cross section $\sigma_2(v)$ into the above equation.

(S203) According to the operation parameter, the relevant parameter data, the beam trajectories and the effective electron-impact ionization cross-section data, the signal-noise ratios of the plurality of candidate particle elements are calculated through the following equation:

$$I_d/I_0 = n_e \sigma_{eff}^1 w \cdot \exp\left(-\int_0^{t_i} n_e \sigma_{eff}^1 dl - \int_{t_i}^d n_e \sigma_{eff}^2 dl\right);$$

where $I_d/I_0$ represents a signal-noise ratio; $n_e$ represents the electron density of the plasma; w represents a width of the entrance slit; d represents the differential sign; dl represents a differential of l; l represents the beam trajectory; $t_i$ represents a time that the neutral beam reaches the core of the plasma to undergo collision ionization to generate the primary beam; $t_d$ represents a time that the primary beam exits the plasma; and $\sigma_{eff}^1$ is the primary effective collision ionization cross section, and $\sigma_{eff}^2$ is the secondary effective collision ionization cross section.

(204) According to the signal-noise ratios of the plurality of candidate particle elements, an element with a signal-noise ratio higher than $10^{-3}$ is selected as the neutral beam particle element for the diagnosis.

It should be noted that the signal-noise ratio $I_d/I_0$ is calculated, and the element with the signal-noise ratio as big as possible and $I_d/I_0 > 10^{-3}$ is selected as the neutral beam particle element for diagnosis.

(S300) Based on particle mass data of the neutral beam particle element, a preset parameter which enables the beam trajectories to pass through an entrance slit of an analyzer is obtained by performing iterative calculation, where the preset parameter includes incident energy, an incident angle and sampling area.

It can be understood that the step (S300) includes steps (S301)-(S302).

(S301) The beam trajectories varying in incident velocity, incident angle and sampling area are obtained through beam trajectory calculation, where the beam trajectories include a trajectory of the neutral beam arriving at the first sampling area and a trajectory of the primary beam generated by the collision ionization.

Figure 3:
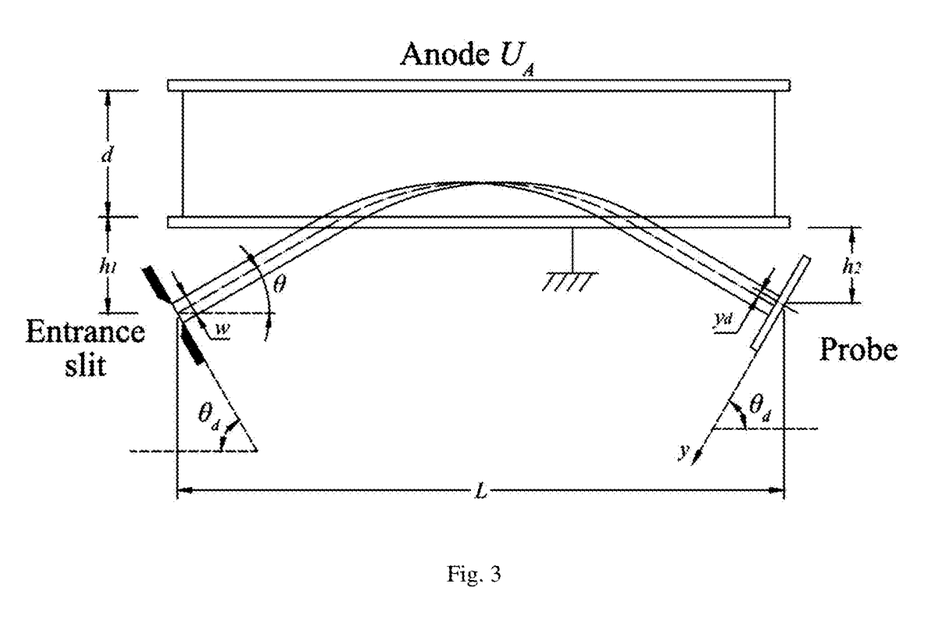
FIG. 3 is a structure diagram of an analyzer of the diagnostic method according to an embodiment of the present disclosure.

(S302) The beam trajectories are subjected to the iterative calculation to obtain preset parameter which enables the beam trajectories to pass through the entrance slit of the analyzer, where the preset parameter includes the neutral beam incident energy, the neutral beam incident angle and sampling area.

It should be noted that according to a formula, the primary beam trajectories generated by the collision ionization of the neutral beam with different incident velocities $v_0$ and different incident angles along different positions of its trajectory are calculated, and followed by iteration to obtain three preset parameters corresponding to the ion beam trajectories which are enabled to pass through the entrance slit of the analyzer, including the neutral beam incident energy $$E_0 = \frac{1}{2} m v_0^2,$$

the incident angle and an area of the collision ionization (the sampling area), that is, the primary beam generated in the sampling area on its trajectory of the neutral beam injected at a preset incident energy and a preset incident angle can enter the analyzer to be collected. At this time, an energy difference can be calculated to obtain a potential of a first sampling area. By using an iterative formula, the preset incident energy and the preset incident angle are changed to obtain a potential of a second sampling area. The above steps are repeated to obtain potential spatial distribution of the plasma at different radial positions and a radial electric field.

Figure 4:
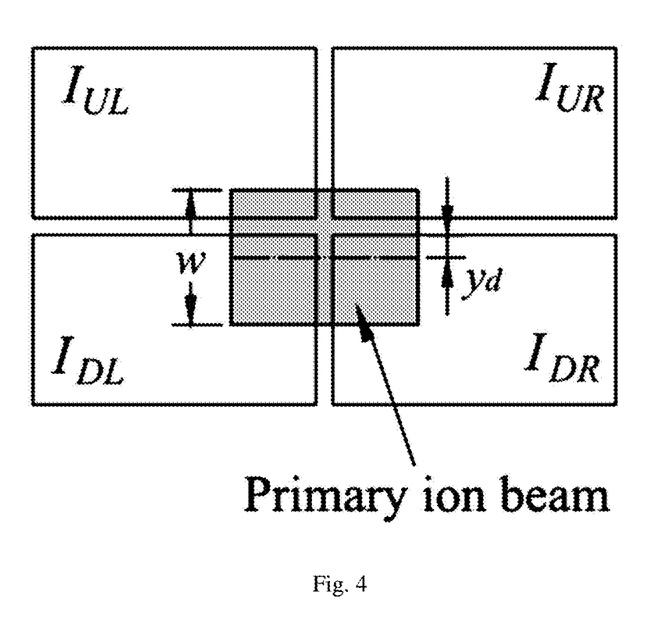
FIG. 4 is a structure diagram of a probe of the diagnostic method according to an embodiment of the present disclosure.

(S400) A solid-state thermionic source corresponding to the neutral beam particle element is heated to generate ions, and the ions are accelerated by utilizing Pierce electrode equipment to obtain a directed ion beam. The directed ion beam is subjected to exchange with a preset neutral gas to generate a neutral beam with the preset incident energy. Based on the preset parameter, the neutral beam is injected into the plasma at the preset incident angle.

It should be noted that the primary beam is generated after the collision ionization of the neutral beam in the sampling area, and then the primary beam enters the analyzer. Therefore, the analyzer is configured to analyze the primary beam to calculate an energy of the primary beam.

It can be understood that the step (S400) includes steps (S401)-(S402).

(S401) A solid-state thermionic source corresponding to the neutral beam particle element is selected and heated to generate the ions. The ions are accelerated by utilizing the Pierce electrode equipment, and are focused under the action of an electrostatic lens to obtain the directed ion beam.

It should be noted that the corresponding solid-state thermionic source is selected and heated to generate the ions. The ions are accelerated by utilizing the Pierce electrode equipment with electrode voltage of $U_0 = E_0/e$. The ions are focused under the action of the electrostatic lens to obtain the directed ion beam with energy $E_0$.

(S402) The directed ion beam is led into a neutralizer tank followed by exchanging with the preset neutral gas charge to generate the neutral beam with the preset incident energy. And the neutral beam is injected into the plasma at the preset incident angle.

(S500) A primary beam generated by the collision ionization of the neutral beam in the sampling area is analyzed and calculated by the analyzer to obtain the energy of the primary beam. Based on the energy difference between the primary beam and the neutral beam, the potential of the first sampling area is obtained according to law of conservation of energy. The above steps are repeated, and an energy of a primary beam in the second sampling area is collected. The potential spatial distribution of the plasma at different radial positions and the radial electric field are obtained, and the diagnosis is finished.

It can be understood that the step (S500) includes steps (S501)-(S502).

(S501) The primary beam generated by the collision ionization in the first sampling area is analyzed and calculated by the analyzer to obtain the energy of the primary beam.

(S502) Based on the energy difference between the primary beam and the neutral beam, the potential of the first sampling area is obtained through the following equation:

$$\varphi_i = \frac{E_d - E_0}{e};$$

where $\varphi_i$ represents the potential of the first sampling area; $E_d$ represents the energy of the primary beam; $E_0$ represents the incident energy of the neutral beam; and e represents the number of electric charges of an electron.

It should be noted that the primary beam is generated by the collision ionization from the neutral beam in the first sampling area, and deflects and exits the plasma under the action of the background magnetic field B. Then the primary beam enters the analyzer, and the analyzer is placed outside the magnetic confinement fusion device where there is no magnetic field. The primary beam passes through the entrance slit of the analyzer then enters a parallel capacitor, and flows to a probe under the action of the electric field. The probe includes a first probe, a second probe, a third probe and a fourth probe, where the first probe and the second probe are arranged above the third probe and the fourth probe; the first probe is arranged on the left side of the second probe, and the third probe is arranged on the left side of the fourth probe. An anode voltage of the parallel capacitor $U_A$ is adjusted by a program control software, so that the first probe, the second probe, the third probe and the fourth probe can collect the primary beam. A first current intensity $I_U$ is represented as $I_U=I_{UL}+I_{UR}$, and a second current intensity $I_D$ is represented as $I_D=_{DL}+I_{DR}$, where $I_{UL}$ represents an electric current of the first probe; $I_{UR}$ represents an electric current of the second probe; $I_{DL}$ represents an electric current of the third probe; and $I_{DR}$ represents an electric current of the fourth probe.

By calculating a current difference ratio between the first current intensity and the second current intensity, a center position $y_d$ of a fall point of the primary beam on the probe is obtained, and the energy of the primary beam energy $E_d$ is also obtained through the following equations:

$$y_d = \frac{I_D - I_U}{I_D + I_U} \cdot \frac{w}{2};$$

where $I_U$ represents the first current intensity and $I_D$ represents the second current intensity;

$$E_d = \frac{L\tan\theta - h_1 - h_2 - y_d(\cos\theta_d \tan\theta + \sin\theta_d)}{4d\sin^2\theta} eU_A;$$

where $h_1$ represents a vertical height between the entrance slit and the third probe and the fourth probe, and $h_2$ represents a vertical height between the center position of the probe and the third probe and the fourth probe; L represents a horizontal distance between the entrance slit and the center position of the probe; d represents a distance between the first probe together with the second probe and the third probe together with the fourth probe; $\theta$ represents a horizontal angle when the primary beam passes through the entrance slit; $\theta_d$ represents a horizontal angle between the entrance slit and the probe; e represents the number of electric charges of the electron; and $U_A$ represents the anode voltage of the parallel capacitor.

It can be understood that steps (S300)-(S500) are repeated to collect the energy of the primary beam $E_d$ generated in the sampling area. Based on the energy difference between the primary beam and the neutral beam, the potential spatial distribution $\varphi_i$ of the plasma at different radial positions is obtained. According to a formula $E_r=-\nabla_r\varphi_i$, the radial electric field $E_r$ of the plasma is calculated.

Embodiment 2

Figure 5:
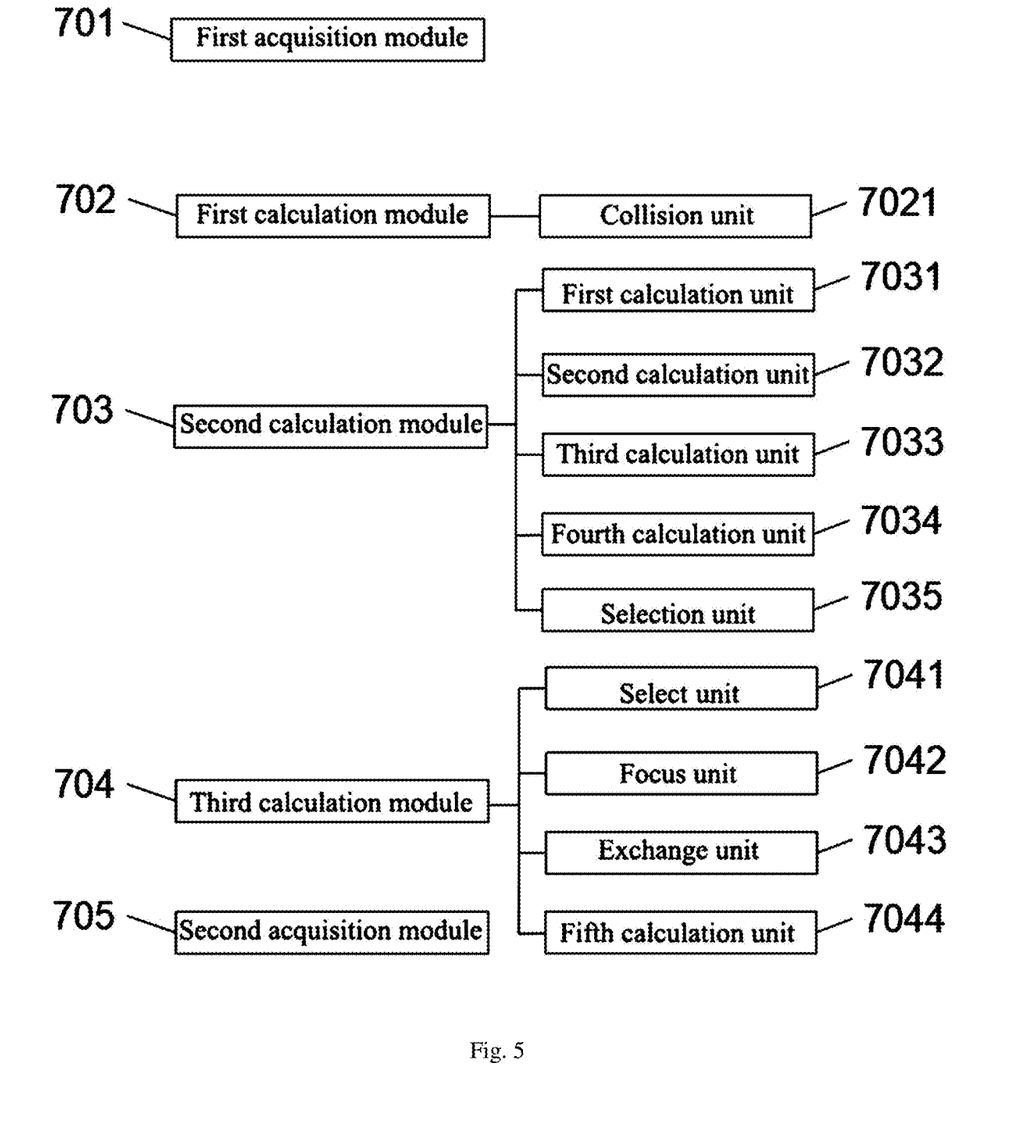
FIG. 5 is diagram of a diagnostic system for measuring potential and electric field of plasma according to an embodiment of the present disclosure.

A diagnostic system for measuring potential and an electric field of plasma is provided in this embodiment, including a first acquisition module 701, a first calculation module 702, a second calculation module 703, a third calculation module 704 and a second acquisition module 705.

The first acquisition module 701 is configured to select a plurality of candidate particle elements according to an operation parameter of a magnetic confinement fusion device to obtain relevant parameter data of the plurality of candidate particle elements, where the relevant parameter data includes particle mass data, primary collision ionization cross section data and secondary collision ionization cross section data; and the operation parameter includes a background magnetic field of the magnetic confinement fusion device, an electron temperature of a plasma and an electron density of the plasma.

The first calculation module 702 is configured to calculate beam trajectories and effective electron-impact ionization cross-section data of the plurality of candidate particle elements, and calculate signal-noise ratios of the plurality of candidate particle elements based on the beam trajectories and the effective electron-impact ionization cross-section data. The first calculation module 702 is also configured to select an appropriate element from the plurality of candidate particle elements as a neutral beam particle element for diagnosis according to the signal-noise ratios.

The second calculation module 703 is configured to obtain a preset parameter which enables the beam trajectories to pass through an entrance slit of an analyzer by performing iterative calculation based on particle mass data of the neutral beam particle element, where the preset parameter includes incident energy, incident angle and sampling area.

The third calculation module 704 is configured to heat a solid-state thermionic source corresponding to the neutral beam particle element to generate ions, and accelerate the ions by utilizing Pierce electrode equipment to obtain a directed ion beam. The third calculation module 704 is also configured to exchange the directed ion beam with a preset neutral gas charge to generate a neutral beam with a preset incident energy. Based on the preset parameter, the third calculation module 704 is also configured to inject the neutral beam into the plasma at a preset incident angle.

The second acquisition module 705 is configured to analyze and calculate a primary beam generated by collision ionization of the neutral beam in a first sampling area by the analyzer to obtain an energy of a primary beam. The second acquisition module 705 is configured to obtain a potential of the first sampling area according to law of conservation of energy based on energy difference between the primary beam and the neutral beam, and collect an energy of a primary beam generated in a second sampling area by repeating the iterative calculation and changing the preset parameter, thereby obtaining potential spatial distribution of the plasma at different radial positions and a radial electric field and finish the diagnosis.

In an embodiment, the first calculation module 702 includes a collision unit 7021. The collision unit 7021 is configured to inject a neutral beam of one of the plurality of candidate particle elements into the plasma at a certain incident velocity and a certain incident angle to undergo collision ionization with electrons in the plasma to generate the primary beam based on the particle mass data, where the primary beam deflects and exits the plasma under the action of a background magnetic field. Each of the beam trajectories is calculated as follows:

$$m\frac{d^2r(t)}{dt^2} = q\frac{dr(t)}{dt} \times B; \text{ and}$$

-continued
$$\frac{dr(t=0)}{dt} = v_0;$$

where r(t) represents a beam trajectory; d represents a differential sign; dr(t) represents a differential of r(t); t represents time; dt represents a differential of t; $v_0$ represents an incident velocity of the neutral beam; m represents a particle mass of a corresponding candidate particle element; q represents the number of electric charges; for the neutral beam, q=0, and for the primary beam, q=e, where e represents the number of electric charges of an electron; B represents the background magnetic field; a particle movement velocity $v_b$ along the beam trajectory is basically unchanged, and is represented as $$v_b = \left|\frac{dr(t)}{dt}\right| \approx v_0;$$

for neutral beams of other elements among the plurality of candidate particle elements, in the same beam trajectory, an incidence velocity $v_0'$ is obtained according to the same Larmor radius through the following equation:

$$\frac{v_0'}{v_0} = \frac{m}{m'},$$

where m' represents particle mass of the other elements.

In an embodiment, the first calculation module 702 includes a third calculation unit 7033, a fourth calculation unit 7034 and a selection unit 7035.

The third calculation unit 7033 is configured to obtain the effective electron-impact ionization cross-section data based on a Maxwell speed distribution function, the primary collision ionization cross section data and the secondary collision ionization cross section data through the following equation:

$$\sigma_{eff} = \frac{\langle \sigma v \rangle}{v_b} = \int_0^\infty \sigma(v) v f(v) dv =$$
$$\sqrt{\frac{m_e}{2\pi k T_e}} \frac{1}{v_b^2} \int_0^\infty \sigma(v) v^2 \left[\exp\left(-\frac{m_e}{2kT_e}(v-v_b)^2\right) - \exp\left(-\frac{m_e}{2kT_e}(v+v_b)^2\right)\right] dv;$$

where v represents a particle-electron relative velocity, and v=|$v_b$−$v_e$|, where $v_b$ represents a particle movement velocity, and $v_e$ represents an electron movement velocity; d represents the differential sign; dv represents a differential of v; f(v) represents the Maxwell speed distribution function; $T_e$ represents the electron temperature of the plasma; $m_e$ represents an electron mass; k represents a Boltzmann constant; σ(v) represents a collision ionization cross section; $\sigma_{eff}$ represents an effective collision ionization cross section, where a primary effective collision ionization cross section $\sigma_{eff}^1$ is obtained by substituting a primary collision ionization cross section $\sigma_1(v)$ into the above equation, and a secondary effective collision ionization cross section $\sigma_{eff}^2$ is obtained by substituting a secondary collision ionization cross section $\sigma_2(v)$ into the above equation.

The fourth calculation unit 7034 is configured to calculate the signal-noise ratios of the plurality of candidate particle elements according to the operation parameter, the relevant parameter data, the beam trajectories and the effective electron-impact ionization cross-section data through the following equation:

$$I_d/I_0 = n_e \sigma_{eff}^1 w \cdot \exp\left(-\int_0^{t_i} n_e \sigma_{eff}^1 dl - \int_{t_i}^{t_d} n_e \sigma_{eff}^2 dl\right);$$

where $n_e$ represents the electron density of the plasma; w represents a width of the entrance slit; d represents the differential sign; dl represents a differential of l; l represents the beam trajectory; $t_i$ represents a time that the neutral beam reaches a core of the plasma to undergo collision ionization to generate the primary beam; $t_d$ represents a time that the primary beam exits the plasma; $I_d/I_0$ represents a signal-noise ratio; and $\sigma_{eff}^1$ is the primary effective collision ionization cross section, and $\sigma_{eff}^2$ is the secondary effective collision ionization cross section.

The selection unit 7035 is configured to select an element with a signal-noise ratio higher than $10^{-3}$ as the neutral beam particle element for diagnosis according to the signal-noise ratios of the plurality of candidate particle elements.

In an embodiment, the second calculation unit 703 includes a first calculation unit 7031 and a second calculation unit 7032.

The first calculation unit 7031 is configured to obtain the beam trajectories varying in incident velocity, incident angle and sampling area through beam trajectory calculation, where the beam trajectories include a trajectory of the neutral beam arriving at the first sampling area and a trajectory of the primary beam generated by the collision ionization.

The second calculation unit 7032 is configured to subject the beam trajectories to the iterative calculation to obtain the preset parameter which enables the beam trajectories to pass through the entrance slit of the analyzer, where the preset parameter includes the neutral beam incident energy, a neutral beam incident angle and sampling area.

In an embodiment, the third calculation module 704 includes a select unit 7041, a focus unit 7042 and an exchange unit 7043.

The select unit 7041 is configured to select the neutral beam particle element according to the signal-noise ratios.

The focus unit 7042 is configured to select and heat a solid-state thermionic source corresponding to the neutral beam particle element to generate the ions. The focus unit 7042 is also configured to accelerate the ions by utilizing the Pierce electrode equipment, and focus the ions under the action of an electrostatic lens to obtain the directed ion beam.

The exchange unit 7043 is configured to lead the directed ion beam into a neutralizer tank, and exchange the directed ion beam with the preset neutral gas charge to generate the neutral beam with the preset incident energy. The exchange unit 7043 is also configured to inject the neutral beam into the plasma at a preset incident angle.

In an embodiment, the third calculation module 704 further includes a fifth calculation unit 7044.

The fifth calculation unit 7044 is configured to obtain the potential of the first sampling area based on the energy difference between the primary beam and the neutral beam through the following equation:

$$\varphi_i = \frac{E_d - E_0}{e};$$

where $\varphi_i$ represents the potential of the first sampling area; $E_d$ represents the primary beam energy; $E_0$ represents the incident energy of the neutral beam; and e represents number of electric charges of the electron.

In summary, the present disclosure provides a system including a neutral beam injector and the analyzer. The neutral beam injector includes the solid-state thermionic source, a Pierce electrode, the electrostatic lens, a neutralizer tank and two Faraday cups, and is configured to provide the neutral beam with a certain energy. The analyzer includes the entrance slit, the parallel capacitor and the probe, and is configured to measure the energy of the primary beam generated by the collision ionization in the sampling area. Based on the energy difference between the primary beam and the neutral beam, the potential (electric field) and its fluctuation of the plasma are obtained according to the law of conservation of energy. The present disclosure has the advantages of small interference and high temporal-spatial resolution, and is still able to obtain relatively high signal-noise ratios with low temperature or low electron density. The present disclosure is the only measurement mean that can be used to directly measure the potential and the electric field in the plasma with low parameters, which has extremely important significance for in-depth study of the physical mechanism of turbulent inhibition by $E_r \times B$ flow shear in the magnetic confinement fusion plasma and confinement improvement.

It should be noted that specific manners performed by each of modules in the system has been described in detail in the above embodiment, and will not be described in detail herein.

Described above are only preferred embodiments of the disclosure, and are not intended to limit the scope of this application. For those skilled in the art, the disclosure may be subject to various alterations and variations. Any modifications, equivalent replacements and improvements made by those skilled in the art within the spirit and principle of this application shall fall within the scope of this application defined by the appended claims.

What is claimed is:

1. A diagnostic method for measuring potential and electric field of plasma, comprising:
   (1) according to an operation parameter of a magnetic confinement fusion device, selecting a plurality of candidate particle elements, and obtaining relevant parameter data of the plurality of candidate particle elements; wherein the relevant parameter data comprises particle mass data, primary collision ionization cross section data and secondary collision ionization cross section data; the operation parameter comprises a background magnetic field of the magnetic confinement fusion device, an electron temperature of a plasma and an electron density of the plasma;
   (2) based on the operation parameter and the relevant parameter data, calculating beam trajectories and effective electron-impact ionization cross-section data of the plurality of candidate particle elements, and calculating signal-noise ratios of the plurality of candidate particle elements based on the beam trajectories and the electron-impact ionization cross-section data; and according to the signal-noise ratios, selecting an appropriate element from the plurality of candidate particle elements as a neutral beam particle element for diagnosis;
   (3) based on particle mass data of the neutral beam particle element, performing iterative calculation to obtain a preset parameter which enables the beam trajectories to pass through an entrance slit of an analyzer; wherein the preset parameter comprises incident energy, incident angle and sampling area;
   (4) heating a solid-state thermionic source corresponding to the neutral beam particle element to generate ions, and accelerating the ions by utilizing Pierce electrode equipment to obtain a directed ion beam; subjecting the directed ion beam to exchange with a preset neutral gas charge to generate a neutral beam with a preset incident energy; and based on the preset parameter, injecting the neutral beam into the plasma at a preset incident angle; and
   (5) analyzing and calculating, by the analyzer, a primary beam generated by collision ionization of the neutral beam in a first sampling area to obtain an energy of a primary beam; based on energy difference between the primary beam and the neutral beam, obtaining a potential of the first sampling area according to law of conservation of energy; and repeating the iterative calculation and changing the preset parameter, so as to collect an energy of a primary beam generated in a second sampling area, thereby obtaining potential spatial distribution of the plasma at different radial positions and a radial electric field; and finishing the diagnosis;

wherein the step of calculating the beam trajectories based on the operation parameter and the relevant parameter data comprises:

based on the particle mass data, injecting a neutral beam of one of the plurality of candidate particle elements into the plasma at a certain incident velocity and a certain incident angle to undergo collision ionization with electrons in the plasma to generate the primary beam; wherein the primary beam deflects and exits the plasma under the action of a background magnetic field; and each of the beam trajectories is calculated as follows:

$$m\frac{d^2 r(t)}{dt^2} = q\frac{dr(t)}{dt} \times B;$$

and $$\frac{dr(t=0)}{dt} = v_0;$$

wherein r(t) represents a beam trajectory; d represents a differential sign; dr(t) represents a differential of r(t); t represents time; dt represents a differential of t, $v_0$ represents an incident velocity of the neutral beam; m represents a particle mass of a corresponding candidate particle element; q represents the number of electric charges; for the neutral beam, q=0, and for the primary beam, q=e, wherein e represents the number of electric charges of an electron; B represents the background magnetic field; a particle movement velocity $v_b$ along the beam trajectory is represented as $$v_b = \left|\frac{dr(t)}{dt}\right| \approx v_0;$$

for neutral beams of other elements among the plurality of candidate particle elements, in the same beam trajectory, an incident velocity $v_a'$ is obtained according to the same Larmor radius through the following equation:

$$\frac{v_0'}{v_0} = \frac{m}{m'},$$

wherein m' represents particle mass of the other elements;

the step (2) is performed through steps of: calculating the effective electron-impact ionization cross-section data based on a Maxwell speed distribution function, the primary collision ionization cross section data and the secondary collision ionization cross section data through the following equation:

$$\sigma_{eff} = \frac{\langle \sigma v \rangle}{v_b} = \int_0^\infty \sigma(v) v f(v) dv =$$
$$\sqrt{\frac{m_e}{2\pi k T_e}} \frac{1}{v_b^2} \int_0^\infty \sigma(v) v^2 \left[ \exp\left(-\frac{m_e}{2kT_e}(v-v_b)^2\right) - \exp\left(-\frac{m_e}{2kT_e}(v+v_b)^2\right) \right] dv;$$

wherein v represents a particle-electron relative velocity, and $v=|v_b-v_e|$, wherein, $v_b$ represents a particle movement velocity, and $v_e$ represents an electron movement velocity; d represents the differential sign; dv represents a differential of v; f(v) represents the Maxwell speed distribution function; $T_e$ represents the electron temperature of the plasma; $m_e$ represents an electron mass; k represents a Boltzmann constant; σ(v) represents a collision ionization cross section; $\sigma_{eff}$ represents an effective collision ionization cross section, wherein a primary effective collision ionization cross section $\sigma_{eff}^1$ is obtained by substituting a primary collision ionization cross section $\sigma_1(v)$ into the above equation, and a secondary effective collision ionization cross section $\sigma_{eff}^2$ is obtained by substituting a secondary collision ionization cross section $\sigma_2(v)$ into the above equation;

calculating the signal-noise ratios of the plurality of candidate particle elements according to the operation parameter, the relevant parameter data, the beam trajectories and the effective electron-impact ionization cross-section data through the following equation:

$$I_d/I_0 = n_e \sigma_{eff}^1 w \cdot \exp\left(-\int_0^{t_i} n_e \sigma_{eff}^1 dl - \int_{t_i}^{t_d} n_e \sigma_{eff}^2 dl\right);$$

wherein $I_d/I_0$ represents a signal-noise ratio; $n_e$ represents the electron density of the plasma; w represents a width of the entrance slit; d represents the differential sign; dl represents a differential of l; l represents the beam trajectory; $t_i$ represents a time that the neutral beam reaches a core of the plasma to undergo collision ionization to generate the primary beam; $t_d$ represents a time that the primary beam exits the plasma; and $\sigma_{eff}^1$ is the primary effective collision ionization cross section, and $\sigma_{eff}^2$ is the secondary effective collision ionization cross section; and according to the signal-noise ratios of the plurality of candidate particle elements, selecting an element with a signal-noise ratio higher than $10^{-3}$ as the neutral beam particle element for the diagnosis;

in the step (5), the potential is obtained through the following equation:

$$\varphi_i = \frac{E_d - E_0}{e};$$

wherein $\varphi_i$ represents the potential of the first sampling area; $E_d$ represents the energy of the primary beam; $E_0$ represents the incident energy of the neutral beam; and e represents the number of electric charges of an electron.

2. The diagnostic method of claim 1, wherein the step (3) is performed through steps of:
obtaining the beam trajectories varying in incident velocity, incident angle and sampling area through beam trajectory calculation; wherein the beam trajectories comprise a trajectory of the neutral beam arriving at the first sampling area and a trajectory of the primary beam generated by the collision ionization; and
subjecting the beam trajectories to the iterative calculation to obtain the preset parameter which enables the beam trajectories to pass through the entrance slit of the analyzer; wherein the preset parameter comprises the neutral beam incident energy, a neutral beam incident angle and sampling area.

3. The diagnostic method of claim 1, wherein the step (4) is performed through steps of:
selecting the solid-state thermionic source corresponding to the neutral beam particle element, and heating the solid-state thermionic source to generate the ions; and accelerating the ions by utilizing the Pierce electrode equipment, and focusing the ions under the action of an electrostatic lens to obtain the directed ion beam; and
leading the directed ion beam into a neutralizer tank followed by exchanging with the preset neutral gas charge to generate the neutral beam with the preset incident energy; and injecting the neutral beam into the plasma at a preset incident angle.

4. A diagnostic system for implementing the diagnostic method of claim 1, comprising:
a first acquisition module;
a first calculation module;
a second calculation module;
a third calculation module; and
a second acquisition module;
wherein the first acquisition module is configured to select a plurality of candidate particle elements according to an operation parameter of a magnetic confinement fusion device to obtain relevant parameter data of the plurality of candidate particle elements; wherein the relevant parameter data comprises particle mass data, primary collision ionization cross section data and secondary collision ionization cross section data; the operation parameter comprises a background magnetic field of the magnetic confinement fusion device, an electron temperature of a plasma and an electron density of the plasma;
the first calculation module is configured to calculate beam trajectories and effective electron-impact ionization cross-section data of the plurality of candidate particle elements, and calculate signal-noise ratios of the plurality of candidate particle elements based on the beam trajectories and the effective electron-impact ionization cross-section data; and the first calculation module is also configured to select an appropriate element from the plurality of candidate particle elements as a neutral beam particle element for diagnosis according to the signal-noise ratios;

the second calculation module is configured to obtain a preset parameter which enables the beam trajectories to pass through an entrance slit of an analyzer by performing iterative calculation based on particle mass data of the neutral beam particle element; wherein the preset parameter comprises incident energy, incident angle and sampling area;

the third calculation module is configured to heat a solid-state thermionic source corresponding to the neutral beam particle element to generate ions, and accelerate the ions by utilizing Pierce electrode equipment to obtain a directed ion beam; and the third calculation module is also configured to exchange the directed ion beam with a preset neutral gas charge to generate a neutral beam with a preset incident energy; and based on the preset parameter, the third calculation module is configured to inject the neutral beam into the plasma at a preset incident angle;

the second acquisition module is configured to analyze and calculate a primary beam generated by collision ionization of the neutral beam in a first sampling area by the analyzer to obtain an energy of a primary beam; and the second acquisition module is configured to obtain a potential of the first sampling area according to law of conservation of energy based on energy difference between the primary beam and the neutral beam, and collect an energy of the primary beam generated in a second sampling area by repeating the iterative calculation and changing the preset parameter, thereby obtaining potential spatial distribution of the plasma at different radial positions and a radial electric field.

5. The diagnostic system of claim 4, wherein the first calculation module comprises:

a collision unit;

wherein the collision unit is configured to inject a neutral beam of one of the plurality of candidate particle elements into the plasma at a certain incident velocity and a certain incident angle to undergo collision ionization with electrons in the plasma to generate the primary beam based on the particle mass data; wherein the primary beam deflects and exits the plasma under the action of a background magnetic field; and each of the beam trajectories is calculated as follows:

$$m\frac{d^2r(t)}{dt^2} = q\frac{dr(t)}{dt} \times B;$$

and $$\frac{dr(t=0)}{dt} = v_0;$$

wherein r(t) represents a beam trajectory; d represents a differential sign; dr(t) represents a differential of r(t); t represents time; dt represents a differential of t, $v_0$ represents an incident velocity of the neutral beam; m represents a particle mass of a corresponding candidate particle element; q represents the number of electric charges; for the neutral beam, q=0, and for the primary beam q=e, wherein e represents the number of electric charges of an electron; B represents the background magnetic field; a particle movement velocity $v_b$ along the beam trajectory is represented as $$v_b = \left|\frac{dr(t)}{dt}\right| \approx v_0;$$

for neutral beams of other elements among the plurality of candidate particle elements, in the same beam trajectory, an incidence velocity $v_0$ is obtained according to the same Larmor through the following equation:

$$\frac{v_0'}{v_0} = \frac{m}{m'},$$

wherein m' represents particle mass of the other elements.

6. The diagnostic system of claim 4, wherein the second calculation module comprises:

a first calculation unit; and a second calculation unit;

wherein the first calculation unit is configured to obtain the beam trajectories varying in incident velocity, incident angle and sampling area through beam trajectory calculation; wherein the beam trajectories comprise a trajectory of the neutral beam arriving at the first sampling area and a trajectory of the primary beam generated by the collision ionization; and the second calculation unit is configured to subject the beam trajectories to the iterative calculation to obtain the preset parameter which enables the beam trajectories pass through the entrance slit of the analyzer; wherein the preset parameter comprises the neutral beam incident energy, a neutral beam incident angle and sampling area.

7. The diagnostic system of claim 4, wherein the third calculation module comprises:

a select unit;

a focus unit; and an exchange unit;

wherein the select unit is configured to select the neutral beam particle element according to the signal-noise ratios;

the focus unit is configured to select the solid-state thermionic source corresponding to the neutral beam particle element, and heat the solid-state thermionic source to generate the ions; and the focus unit is also configured to accelerate to the ions by utilizing the Pierce electrode equipment, and focus the ions under the action of an electrostatic lens to obtain the directed ion beam; and the exchange unit is configured to lead the directed ion beam into a neutralizer tank, and exchange the directed ion beam with the preset neutral gas charge to generate the neutral beam with the preset incident energy; and the exchange unit is also configured to inject the neutral beam into the plasma at a preset incident angle.

* * * * *